US008446154B2

(12) United States Patent
Brady et al.

(10) Patent No.: US 8,446,154 B2
(45) Date of Patent: May 21, 2013

(54) METHODS AND SYSTEMS FOR QUANTIFYING DEGRADATION OF WIRING INSULATION (75) Inventors: Steven Kenneth Brady, Renton, WA (US); Donald Duane Palmer, Jr., Ballwin, MO (US); Selina Brownridge, St. Louis, MO (US)

(73) Assignee: The Boeing Company, Chicago, IL (US)

( * ) Notice: Subject to any disclaimer, the term of this patent is extended or adjusted under 35 U.S.C. 154(b) by 280 days.

(21) Appl. No.: 12/889,631

(22) Filed: Sep. 24, 2010

(65) Prior Publication Data
US 2012/0074955 A1 Mar. 29, 2012

(51) Int. Cl.
*H01H 31/12* (2006.01)

(52) U.S. Cl.
USPC ............................................. 324/551

(58) Field of Classification Search
USPC ......... 324/551, 557, 541, 647, 544, 126–129, 324/663, 672, 673, 679, 680, 686; 340/647
See application file for complete search history.

(56) References Cited

U.S. PATENT DOCUMENTS

| | | | | |
|---|---|---|---|---|
| 3,054,049 A * | 9/1962 | Chance | ........................ | 324/551 |
| 3,178,639 A * | 4/1965 | Hillman | ........................ | 324/539 |
| 3,781,666 A * | 12/1973 | Dornberger | .................... | 324/518 |
| 3,803,484 A * | 4/1974 | Gray | ............................ | 324/544 |
| 4,052,665 A * | 10/1977 | Gruenwald | .................... | 324/530 |
| 4,090,130 A * | 5/1978 | Willenbecher, Jr. | .......... | 324/126 |
| 4,316,142 A * | 2/1982 | Kuramoto | ..................... | 324/127 |
| 4,754,218 A * | 6/1988 | Wagner et al. | ................ | 324/127 |
| 4,777,871 A * | 10/1988 | Stowell | ........................... | 454/12 |
| 4,794,329 A * | 12/1988 | Schweitzer, Jr. | ............. | 324/127 |
| 5,117,191 A * | 5/1992 | Saigo et al. | .................... | 324/551 |
| 5,140,257 A * | 8/1992 | Davis | ............................ | 324/106 |
| 5,818,236 A * | 10/1998 | Sone et al. | .................... | 324/509 |
| 5,854,556 A * | 12/1998 | Steennis et al. | ............... | 324/541 |
| 5,990,687 A * | 11/1999 | Williams | ....................... | 324/529 |
| 6,281,685 B1 * | 8/2001 | Tuttle | ............................ | 324/529 |
| 6,340,891 B1 * | 1/2002 | Yagi et al. | ..................... | 324/551 |
| 6,429,661 B1 * | 8/2002 | Schweitzer, Jr. | ............. | 324/539 |
| 6,882,158 B2 * | 4/2005 | Blades | .......................... | 324/536 |

(Continued)

FOREIGN PATENT DOCUMENTS
GB 1198147 7/1970

OTHER PUBLICATIONS

U.S. Appl. No. 12/844,025, filed Jul. 27, 2010.

(Continued)

*Primary Examiner* — Jermele M Hollington
*Assistant Examiner* — Demetrius Pretlow
(74) *Attorney, Agent, or Firm* — Armstrong Teasdale LLP (57) ABSTRACT

A system for the measurement of degradation of electrical wire insulation quality is described. The system includes a clamping device for engaging the electrical wire to be tested for insulation degradation, the clamping device comprising a channel formed therein for placement of the electrical wire, a plurality of plates placed proximate the channel, the plates electrically connected to generate a capacitance and placed proximate the channel such that the wire insulation provides a portion of a dielectric for the generated capacitance, and a measurement device operatively attached to the plurality of plates such that the measurement device is configured to indicate an amount of degradation associated with the wire insulation based on at least one of the measured capacitance and dissipation factor.

17 Claims, 7 Drawing Sheets

U.S. PATENT DOCUMENTS

| | | | |
|---|---|---|---|
| 7,397,233 B2 * | 7/2008 | Sorensen | 324/76.11 |
| 7,483,140 B1 * | 1/2009 | Cho et al. | 356/445 |
| 7,512,503 B2 * | 3/2009 | Bechhoefer et al. | 702/58 |
| 7,605,593 B2 | 10/2009 | Brady | |
| 7,915,898 B1 * | 3/2011 | Kraemer | 324/527 |
| 2001/0052778 A1 | 12/2001 | Smith | |
| 2002/0024342 A1 * | 2/2002 | Bussinger | 324/541 |
| 2002/0070731 A1 * | 6/2002 | Ohminami | 324/548 |
| 2002/0097056 A1 | 7/2002 | Blades | |
| 2003/0206111 A1 | 11/2003 | Gao et al. | |
| 2004/0182160 A9 * | 9/2004 | Madaras et al. | 73/598 |
| 2006/0158197 A1 * | 7/2006 | Horikoshi et al. | 324/551 |
| 2007/0085548 A1 * | 4/2007 | Shinmoto et al. | 324/508 |
| 2012/0089435 A1 * | 4/2012 | Ehben et al. | 705/7.27 |

OTHER PUBLICATIONS

International Search Report and Written Opinion of PCT/US2011/050446; Nov. 4, 2011; 10 pages.

* cited by examiner

METHODS AND SYSTEMS FOR QUANTIFYING DEGRADATION OF WIRING INSULATION

BACKGROUND

The field of the disclosure relates generally to the service life of wiring insulation, and more specifically, to methods and systems for quantifying degradation of wiring insulation.

Wiring insulation typically consists of one or more electrically insulating polymers. Important properties of these materials such as electrical resistivity and resistance to cracking and chafing often degrade with increasing time after manufacture. The insulation of wires (in service on aircraft for example) can eventually degrade so substantially that unwanted electrical arcing and short circuits can result.

In service equipment may experience degradation in wiring systems that can lead to equipment failures, shorts, arcing, fires, and other operational and safety problems. One area where this degradation may occur is the various insulation and insulative coatings associated with the wiring systems. Of course, in many instances of in-service equipment, such equipment is exposed to extreme conditions (temperature, humidity, fuel immersion, etc.) which may shorten the service life of the wiring systems associated with such equipment. Measurement of the condition of the wire insulation can verify whether or not replacement of the particular wire or wiring system is needed.

However, there are no known non-destructive inspection tests for the evaluation of wire insulation. Wire insulation testing devices do exist for directly measuring the resistance of wiring insulation, but these testing devices, including mega-ohm meters can be destructive to the wires and insulation being tested and generally involve the disassembly and repair of the wiring system being tested.

As such, some of the disadvantages and limitations of the existing wire insulation testing solutions include disruptive system disassembly, costly destructive testing and laboratory analysis, potentially premature wiring replacement, and an inability to predict remaining life of the wiring system and the insulation associated therewith. At least some of the known wire insulation testing solutions incorporate one or more of thermal, oxidative (or "chemical"), and ultraviolet damage measurement of the materials, using infrared spectroscopy systems deployed within portable tools.

BRIEF DESCRIPTION

In one aspect, a system for the measurement of degradation of electrical wire insulation quality is provided. The system includes a clamping device for engaging the electrical wire to be tested for insulation degradation, the clamping device comprising a channel formed therein for placement of the electrical wire, a plurality of plates placed proximate the channel, the plates electrically connected to generate a capacitance and placed proximate the channel such that the wire insulation provides a portion of a dielectric for the generated capacitance, and a measurement device operatively attached to the plurality of plates such that the measurement device is configured to indicate an amount of degradation associated with the wire insulation based on at least one of the measured capacitance and dissipation factor.

In another aspect, a method for non-destructively measuring degradation of wire insulation is provided. The method includes placing the wire within a clamping device such that the insulation associated with the wire is a portion of a dielectric between a plurality of spaced plates forming a capacitance within the clamping device, determining at least one of a capacitance and a dissipation factor of the plate and wire insulation combination, and calculating a state of degradation for the wire insulation by comparing at least one of the determined capacitance and the dissipation factor against a respective capacitance and dissipation factor associated with known good wire insulation.

In still another aspect, a device for engaging an in circuit wire for the purpose of determining a degradation of the insulation associated with the wire is provided. The device includes a clamp for engaging the wire to be tested, the clamp comprising a first jaw and a second jaw, the first jaw and the second jaw each comprising a half-channel formed therein along a longitudinal axis of the jaws, and a plurality of plates placed within both of the half-channels. The jaws are configured for placement adjacent one another in a first position such that the half-channels in combination form a channel for placement of the wire to be tested. The jaws are configured for placement apart from one another in a second position for insertion and removal of the wire to be tested. The plates include a first plurality of the plates electrically connected at a ground electrical potential and a second plurality of the plates electrically connected at a potential other than ground. The plates from the first plurality are alternated with the plates from the second plurality in both the first jaw and the second jaw such that wire insulation placed within the half-channels provides a dielectric for a capacitor formed by the first plurality of plates and the second plurality of plates.

The features, functions, and advantages that have been discussed can be achieved independently in various embodiments or may be combined in yet other embodiments further details of which can be seen with reference to the following description and drawings.

DETAILED DESCRIPTION

Embodiments are described herein which relate to the nondestructive inspection of wiring insulation for degradation that can occur with age, thermal, or chemical exposure. Degradation includes reduced ability to resist electrical arcing and increased brittleness. Specifically, one embodiment of such a testing device includes a wire clamp incorporating capacitive elements placed therein. Measurement techniques that are based on one or more of a capacitance and dissipation factor are utilized with the device to nondestructively inspect wiring insulation for degradation that can occur as described above. The embodiments are capable of determining a condition of the insulation on the wire.

The described non-destructive wiring insulation testing device provides a user with, for example, an "on-aircraft" nondestructive method to detect and quantify any detrimental aging conditions for wiring insulation. Embodiments allow this detection on individual wires by incorporating a wire clamping device to position the wire, and thus the insulation associated with the wire, proximate or adjacent a plurality of capacitive elements.

Figure 1:
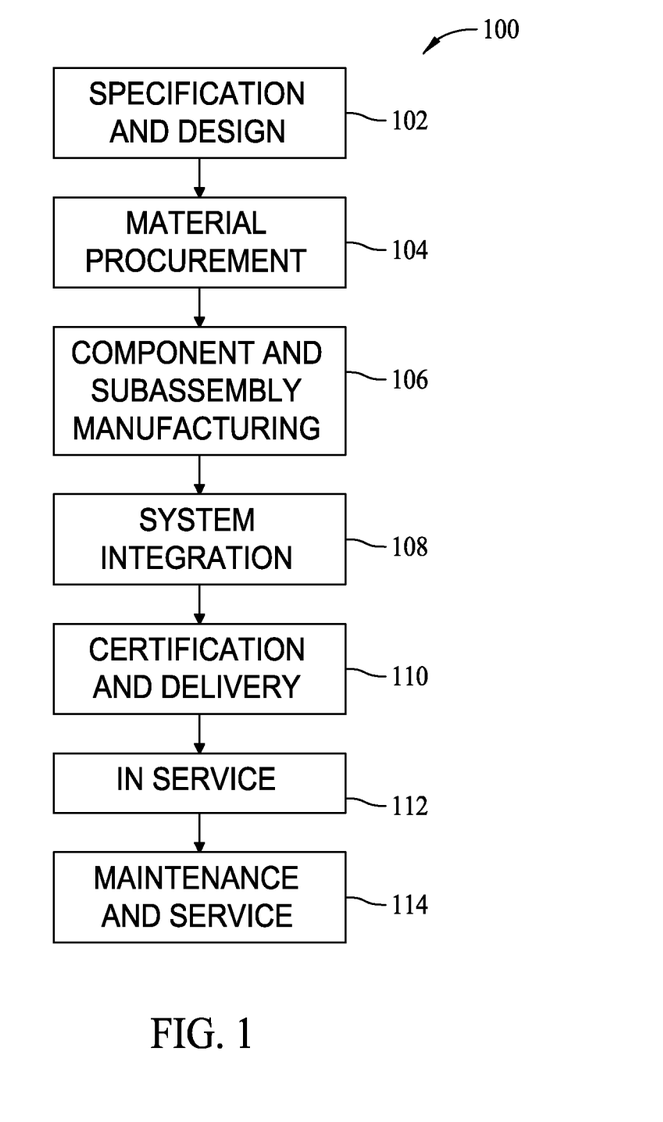
FIG. 1 is a flow diagram of an aircraft production and service methodology.
Figure 2:
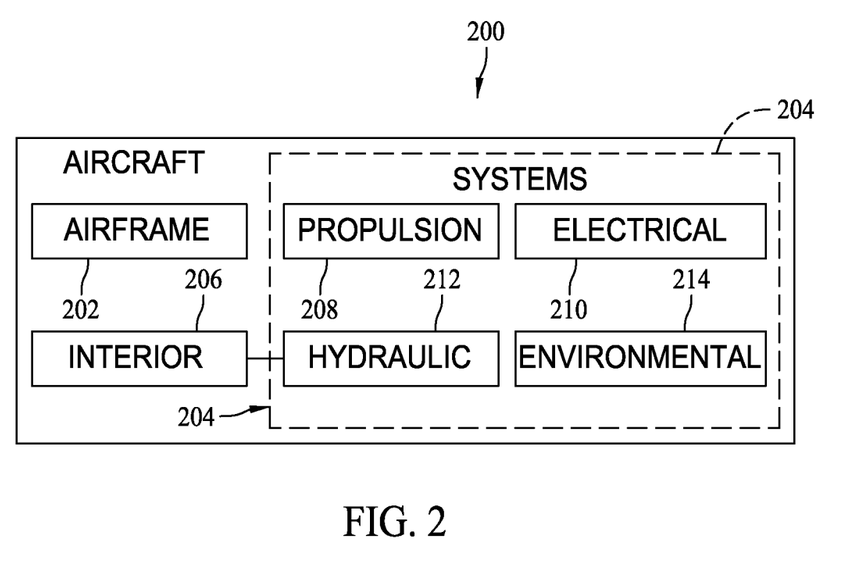
FIG. 2 is a block diagram of an aircraft.

Referring more particularly to the drawings, embodiments of the disclosure may be described in the context of aircraft manufacturing and service method 100 as shown in FIG. 1 and an aircraft 200 as shown in FIG. 2. During pre-production, aircraft manufacturing and service method 100 may include specification and design 102 of aircraft 200 and material procurement 104.

During production, component and subassembly manufacturing 106 and system integration 108 of aircraft 200 takes place. Thereafter, aircraft 200 may go through certification and delivery 110 in order to be placed in service 112. While in service by a customer, aircraft 200 is scheduled for routine maintenance and service 114 (which may also include modification, reconfiguration, refurbishment, and so on).

Each of the processes of aircraft manufacturing and service method 100 may be performed or carried out by a system integrator, a third party, and/or an operator (e.g., a customer). For the purposes of this description, a system integrator may include, without limitation, any number of aircraft manufacturers and major-system subcontractors; a third party may include, for example, without limitation, any number of venders, subcontractors, and suppliers; and an operator may be an airline, leasing company, military entity, service organization, and so on.

As shown in FIG. 2, aircraft 200 produced by aircraft manufacturing and service method 100 may include airframe 202 with a plurality of systems 204 and interior 206. Examples of systems 204 include one or more of propulsion system 208, electrical system 210, hydraulic system 212, and environmental system 214. Any number of other systems may be included in this example. Although an aerospace example is shown, the principles of the disclosure may be applied to other industries, such as the automotive industry.

Apparatus and methods embodied herein may be employed during any one or more of the stages of aircraft manufacturing and service method 100. For example, without limitation, components or subassemblies corresponding to component and subassembly manufacturing 106 may be fabricated or manufactured in a manner similar to components or subassemblies produced while aircraft 200 is in service.

Also, one or more apparatus embodiments, method embodiments, or a combination thereof may be utilized during component and subassembly manufacturing 106 and system integration 108, for example, without limitation, by substantially expediting assembly of or reducing the cost of aircraft 200. Similarly, one or more of apparatus embodiments, method embodiments, or a combination thereof may be utilized while aircraft 200 is in service, for example, without limitation, to maintenance and service 114 may be used during system integration 108 and/or maintenance and service 114 to determine whether parts may be connected and/or mated to each other.

The description of the different advantageous embodiments has been presented for purposes of illustration and description, and is not intended to be exhaustive or limited to the embodiments in the form disclosed. Many modifications and variations will be apparent to those of ordinary skill in the art. Further, different advantageous embodiments may provide different advantages as compared to other advantageous embodiments. The embodiment or embodiments selected are chosen and described in order to best explain the principles of the embodiments, the practical application, and to enable others of ordinary skill in the art to understand the disclosure for various embodiments with various modifications as are suited to the particular use contemplated.

As described above, existing wire insulation testing solutions sometimes include removal and sectioning of the wiring in order to perform laboratory-based testing. On-site testing of wire insulation sometimes involves disconnecting the wire from the circuit. If the wire and insulation pass the tests, it is put back into service. However, such handling of wires is time consuming and the possibility of wire and/or wire insulation damage exists. It is apparent that a non-destructive, in circuit testing solution would be an improvement.

Figure 3:
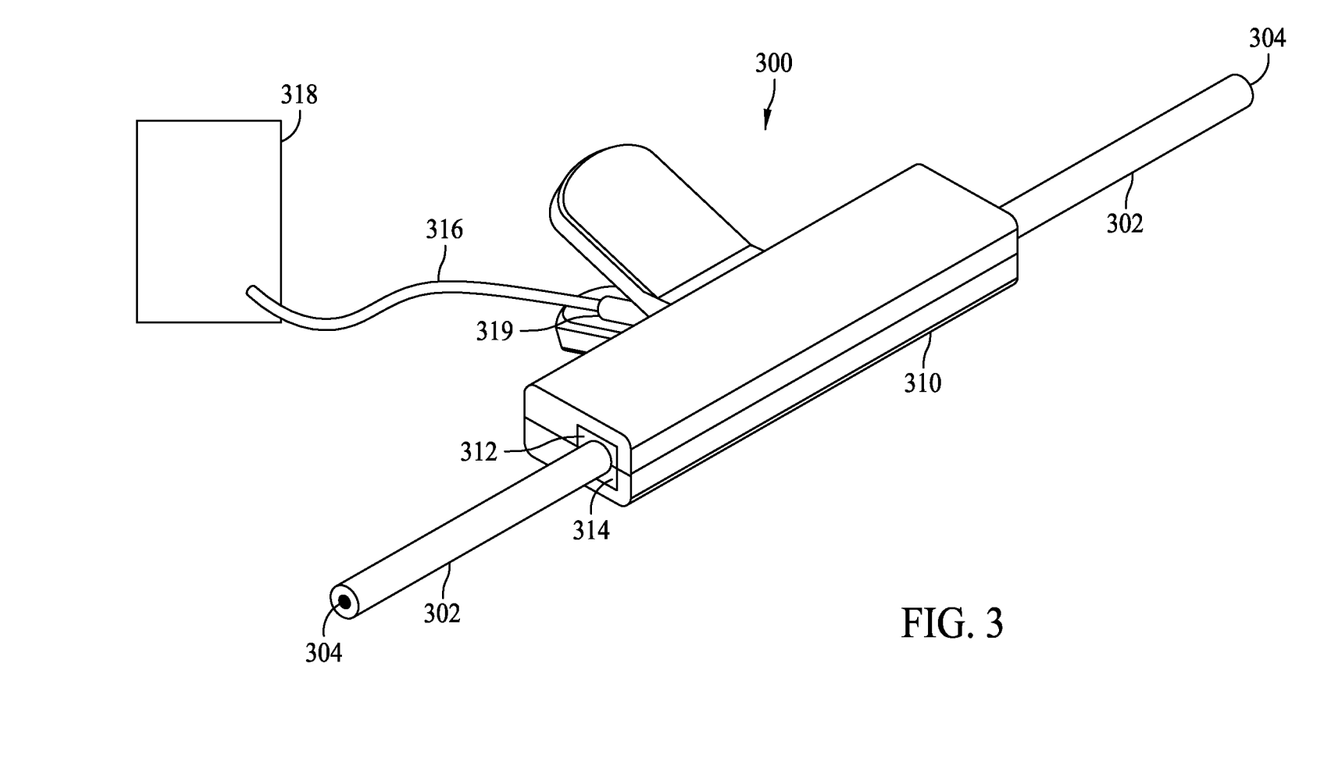
FIG. 3 is an illustration of a clamp that allows for in circuit, nondestructive testing of the insulation associated with a wire.

FIG. 3 is an illustration of a clamp 300 that allows for in circuit, nondestructive testing of the insulation 302 associated with wire 304. Clamp 300 allows for wiring insulation degradation testing without disassembly of the associated electrical circuit. The embodiments of clamp 300 allow for a nondestructive analysis that may be performed, for example, on wiring within an aircraft during a periodic maintenance process. Removal of the need to disassemble the electrical circuit containing wire 304 (and insulation 302) greatly reduces maintenance costs. In addition, tests may be conducted on the wire insulation 302 while the circuits associated with the wire 304 are energized, which, in certain circuit types, allows for additional testing methodologies to be developed. Removal of the need to disassemble the electrical circuit containing the wiring to be tested also increases safety for the inspector of the wiring insulation, reducing the risk of electrical shock.

Embodiments of clamp 300 may include interchangeable wire-guide inserts 312, 314 for installation within clamp 300. An electrical cable 316 may extend from the clamp 300 as described below for electrical connection to a measurement device 318. Wire-guide inserts 312, 314 are interchangeable to accommodate different wire diameters while ensuring capacitive elements (not shown in FIG. 3) within clamp 300 are properly placed with respect to the wire insulation to be tested. More specifically, various embodiments of wire-guide inserts 312, 314 may be utilized to incorporate smaller or larger channels formed therein, as better shown in FIG. 4, for accommodation of different diameters of wire (and insulation) under test. Alternative embodiments may include a circuit (not shown in FIG. 3) disposed within clamp 300. As illustrated in the figures, a longitudinal channel 319 may be formed in clamp 300 to retain electrical cable 316 in place.

Figure 4:
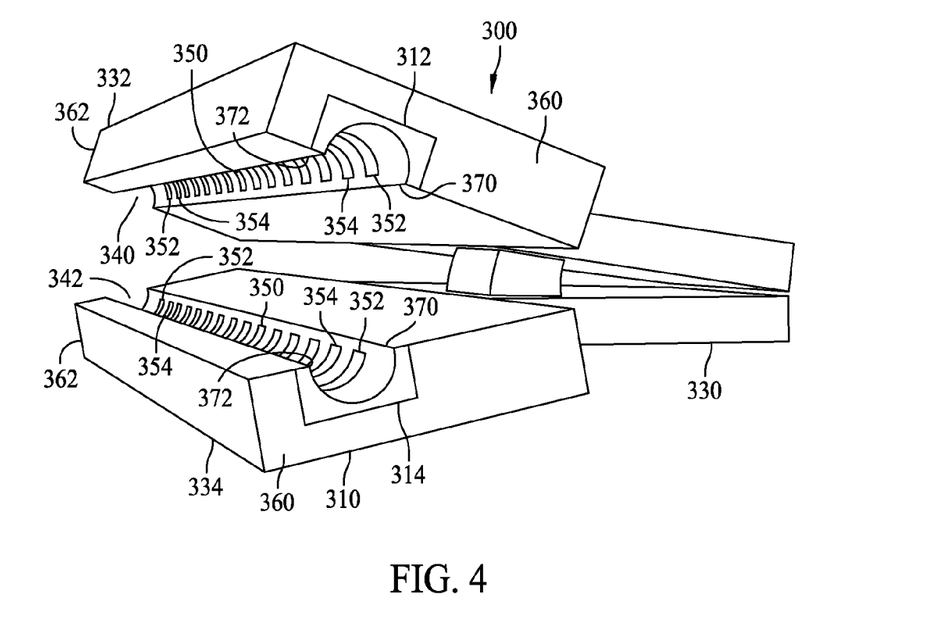
FIG. 4 is an illustration of the clamp of FIG. 3 further illustrating plates mounted therein for generating a capacitance.

FIG. 4 is an illustration of clamp 300 in which a handle 330 is compressed in order to open the opposing jaws 332 and 334 of the clamp 300. The wire and insulation to be inspected fits snugly into half-channels 340 and 342 in respective jaws 332 and 334. In use, the handle 330 is released and the spring-loaded clamp jaws 332 and 334 close adjacent one another with the wire 304 (and insulation 302) within the channel formed by the half-channels 340 and 342 for inspection of the wire insulation.

The upper and lower half-channels 340 and 342 are formed longitudinally across the wire-guide inserts 312 and 314. These wire-guide inserts 312 and 314 can be removed from the jaws 332 and 334 and replaced with wire-guide inserts having channels of different diameters formed therein for inspecting of wire insulation of different diameters. Each jaw 332 and 334 includes a plurality of spaced copper plates 350 which are electrically configured to operate as surface capacitor plates. In embodiments, these plates 350 are within the wire-guide inserts 312, 314. In other embodiments, the wire-guide inserts 312, 314 are fabricated such that they are capable of engaging the plates 350 which are permanently mounted within the jaws 332 and 334 regardless of the diameter of the half channels 340 and 342. In these various embodiments, the plates 352 nearest to ends 360 and 362 of clamp 300 shown are held electrically at a ground potential, without regard to whether DC or AC capacitance is used to inspect the wiring insulation. Holding the end plates 352 at ground is a good design practice for safety and shielding. In embodiments, the plates 350 in each half-channel 340, 342 cover most of the circumference of the channel, for example, about 90% of the channel's circumference includes the material making up plates 350. Setting the plate ends back from the edges 370 and 372 of the channels 340 and 342 lessens the chances of accidental shorts to ground. In one embodiment, plates 350 are a distance from the edges of the half-channels 340 and 342 to lessen the chances of unwanted electrical contacts outside of the channels.

Plates 354, which are next to plates 352, are held at a positive potential (DC) or a varying potential (AC) with respect to ground. Successive plates 350 alternate with regard to electrical potential, including one plate at ground potential, the next plate with a voltage potential relative to ground, and so on. With such an arrangement, there is an odd number of plates 350 in each half-channel 340 and 342 since the plates 352 are proximate each end 360 and 362. All of the plates 350 held at ground potential are electrically common to each other including the plates 350 within the separate jaws 332 and 334. Likewise, all of the plates 350 at a voltage potential relative to ground are electrically common to one another.

When the clamp 300 is operating, electric fringe fields form between neighboring plates 350. These are the fields which store the energy in the capacitor(s) that is formed by the wire insulation/plate combination. These electric fields "bulge" off the surfaces of the channels and penetrate the wiring insulation. The distance of the "bulge" from the surface depends on the spacing of the plates 350. In embodiments, the plates 350 are spaced so as to maximize electric field generated in the wiring insulation within the probe, but minimize electric field generated in the wire itself. In this way, the clamp 300 does not interfere with the electrical circuit incorporating the wire whose insulation is being tested for degradation.

The number of plates 350 within each half-channel 340, 342 contributes to the determination of the overall capacitance of the assembly. More plates result in an increased capacitance, and generally, additional capacitance allows for easier measurement of changing capacitance. However, the dimensions of the clamp are also important since the function of clamp 300 is to get into position, for example into wiring bundles, thereby limiting the amount of area available for plates 350. As such, sizing of the clamp 300 and the number of plates 350 per channel 340, 342 are application specific.

All neighboring pairs of plates 350 in each half-channel 340 and 342 comprise several surface capacitors, which electrically incorporate the wiring insulation as a capacitor dielectric when the clamp 300 is closed and in operation. The dielectric properties of polymer wiring insulation (dielectric constant and/or dissipation factor) change with degradation and aging, which changes the capacitive properties within the clamp 300, for example, capacitance, quality factor, and loss factor. As described with respect to FIGS. 5-7, such capacitance changes are detectable in multiple ways.

Figure 5:
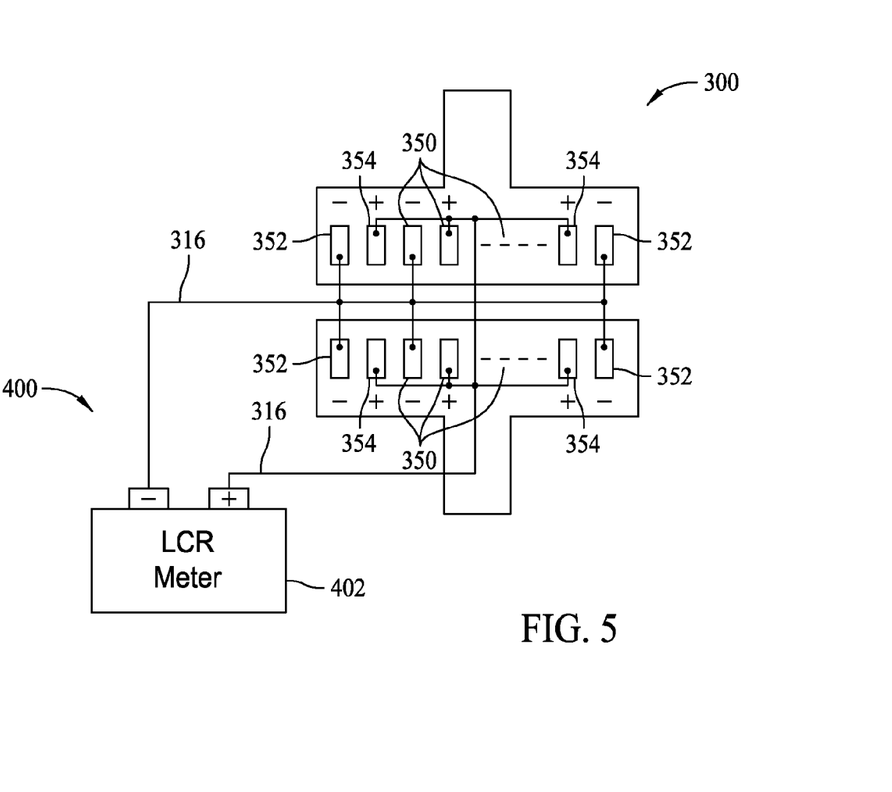
FIG. 5 is an illustration of the clamp of FIG. 4 operatively attached to a capacitance meter.

As illustrated in FIG. 5, one way to measure the changes is to measure the capacitance and dissipation factor of the clamp plate/wire-insulation system 400 with a LCR meter 402. The interconnection of the plates 350 for both jaws of clamp 300 is shown schematically, with electrical cable 316 extending from clamp 300 to LCR meter 402. Changes in the dielectric constant and dissipation of the wire insulation placed into clamp 300 can be measured by LCR meter 402 as changes in measured capacitance and dissipation factor, respectively.

Figure 6:
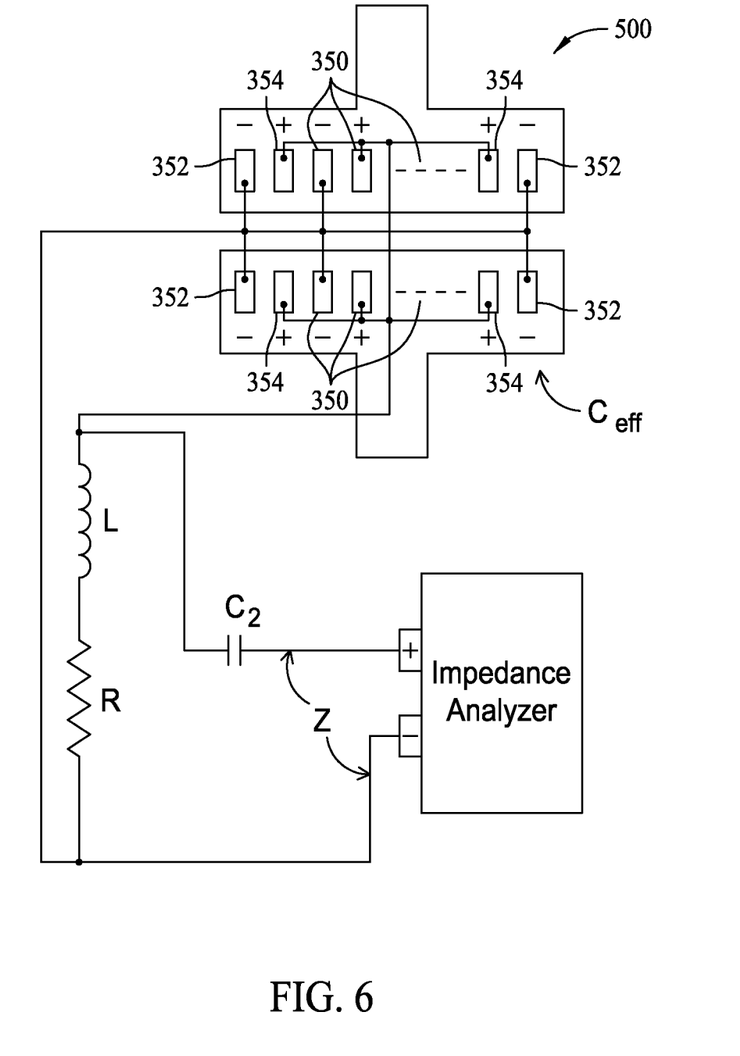
FIG. 6 is an illustration of the clamp of FIG. 4 operatively configured as a portion of an LCR circuit that is attached to an impedance analyzer.

In FIG. 6, a system 500 for testing of wire insulation degradation includes an inductor (L) and a resistor (R) in series between the plates 350 at a voltage potential relative to ground and the plates 350 forming a ground plane. In one embodiment, the inductor L and resistor R are included as circuitry within the clamp 300. In the configuration, the capacitance ($C1_{eff}$) generated by the plates 350 and incorporated wire insulation 302 (not shown in FIG. 6) within the probe 300 become part of a L-C-R resonant circuit with a characteristic frequency and quality (Q) factor. A separate capacitive or inductive element, for example C2, is used to couple to the L-C-R circuit at a practical impedance, for example 50 Ohms at the resonant frequency, to measure the oscillator's resonance characteristics (i.e. resonant frequency, absorption at a chosen frequency, quality factor, etc.) for testing of the wire insulation. In an embodiment, the resonant frequency, ω, is approximately $\sqrt{1/LC1_{eff}}$.

Figure 7:
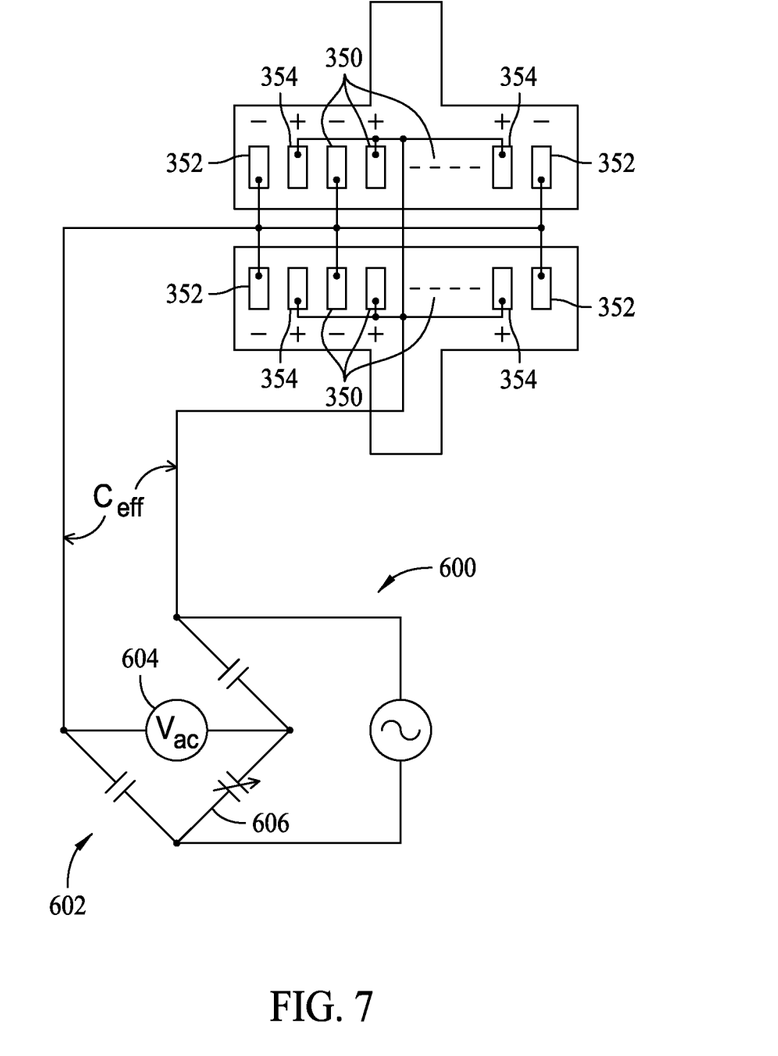
FIG. 7 is an illustration of the clamp of FIG. 4 operatively configured as one leg of an AC Wheatstone bridge.

In FIG. 7, a system 600 for testing of wire insulation degradation includes an AC Wheatstone bridge 602. The capacitance provided by the wire insulation/plate combination is incorporated as one leg of AC Wheatstone bridge 602. In one embodiment, bridge 602 is balanced with a known good piece of wire insulation within the clamp through adjustment of a variable capacitor 606 within the bridge 602. When a wire with degraded insulation is placed within clamp 300, bridge 602 is driven out of balance and detected as a voltage displayed on a meter 604 or other display device.

Those skilled in the art will understand that many ways to detect changes in capacitance exist in addition to the three described herein. However, all have in common the utilization of clamp 300 and the detection of one or more of a changing capacitance and a changing dissipation factor as wire insulation of varying degradation is placed within clamp 300. More particularly the nondestructive and nondisruptive quantification of the degradation state of wire insulation is achieved by exploiting the dielectric properties of polymers that change due to degradation.

Figure 8:
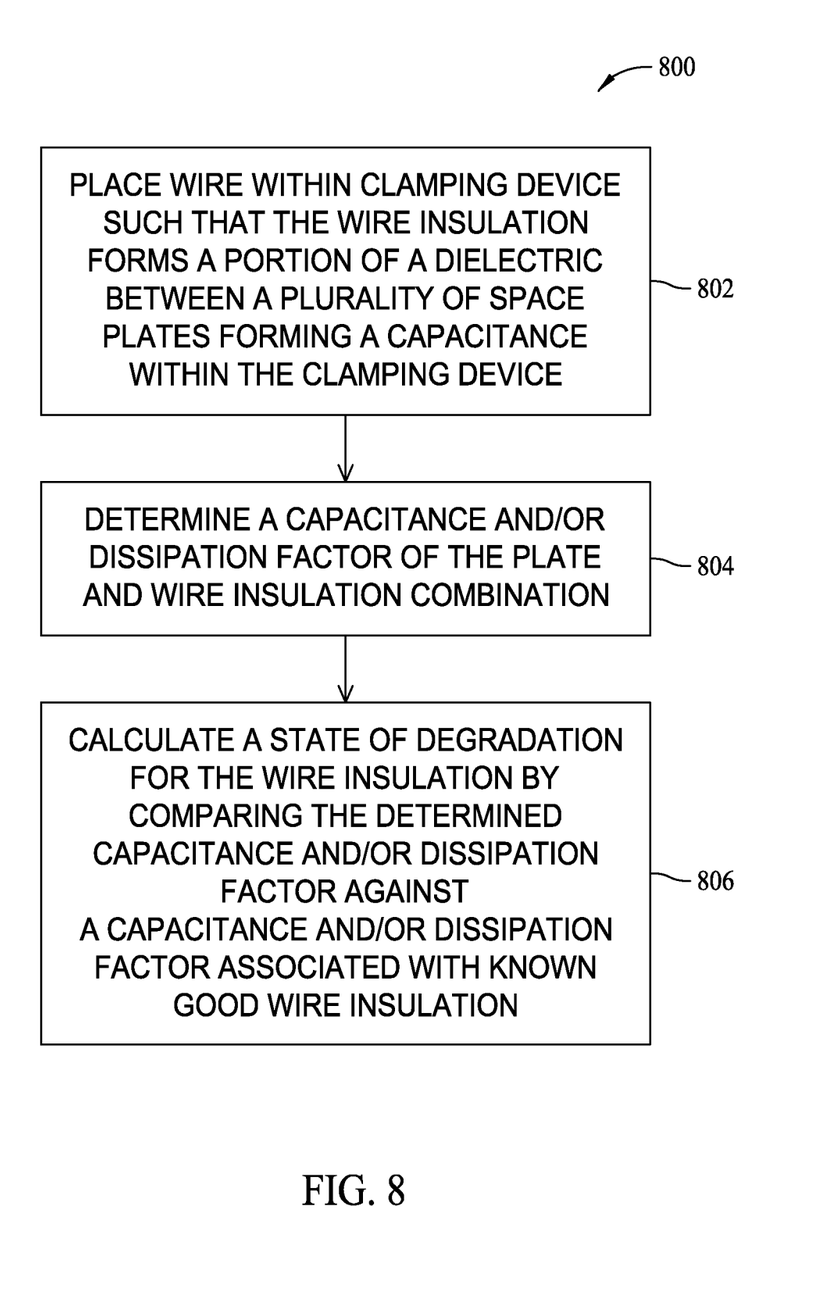
FIG. 8 is a flowchart illustrating an in circuit, nondestructive testing method for insulation associated with a wire.

Based on the embodiments described above, a method for non-destructively measuring degradation of wire insulation is provided, as illustrated by the flowchart 800 of FIG. 8. Initially, a wire is placed 802 within a clamping device such that the insulation associated with the wire insulation is a portion of a dielectric between a plurality of spaced plates forming a capacitance within the clamping device. At least one of a capacitance and a dissipation factor of the plate and wire insulation combination is determined 804, and a state of degradation for the wire insulation is calculated 806 by comparing the determined capacitance and/or dissipation factor against a respective capacitance and/or dissipation factor associated with known good wire insulation.

This written description uses examples to disclose various embodiments, which include the best mode, to enable any person skilled in the art to practice those embodiments, including making and using any devices or systems and performing any incorporated methods. The patentable scope is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal languages of the claims.

What is claimed is:

1. A system for the measurement of degradation of electrical wire insulation quality, said system comprising:
   a clamping device for engaging an electrical wire to be tested for insulation degradation, said clamping device comprising:
   a first jaw;
   a second jaw; and
   a channel formed between said first and second jaws for placement of the electrical wire;
   a plurality of plates placed proximate said channel, said plurality of plates electrically connected to generate a capacitance and placed proximate the channel such that insulation on the electrical wire provides a portion of a dielectric for the generated capacitance, said plurality of plates comprising:
   a first set of plates on said first jaw, said first set of plates including an alternating arrangement of plates configured to be held at a first potential and plates configured to be held at a second potential different than the first potential; and
   a second set of plates on said second jaw, said second set of plates including an alternating arrangement of plates configured to be held at the first potential and plates configured to be held at the second potential; and
   a measurement device operatively attached to said plurality of plates such that said measurement device is configured to indicate an amount of degradation associated with the wire insulation based on at least one of a measured capacitance and a dissipation factor.

2. The system according to claim 1 further comprising a plurality of interchangeable wire-guide inserts insertable within said first and second jaws of said clamping device, said interchangeable wire-guide inserts operable for maintaining a placement of a specific range of wire gauges within said clamping device and maintaining a position of said plurality of plates with respect to the wire insulation within said clamping device.

3. The system of claim 2 wherein said channel is formed with said interchangeable wire-guide inserts, said inserts each comprising a semi-circular, half-channel therein for placement of the wire, said plurality of plates adjacent said half-channel.

4. The system according to claim 1 wherein said plurality of plates extends circumferentially along about 90 percent of the circumference of said channel.

5. The system according to claim 1 wherein first potential is a ground electrical potential, and the second potential is a potential other than ground.

6. The system according to claim 5 wherein said channel comprises a first end and a second end, wherein plates proximate both said first end and said second end of said channel are configured to be held at the ground electrical potential.

7. The system according to claim 1 further comprising an electrical circuit disposed within said clamping device, said electrical circuit operable to electrically interface said plurality of plates to said measurement device.

8. The system according to claim 7 wherein said electrical circuit comprises an LCR circuit, said plurality of plates forming at least a portion of a capacitance portion of said LCR circuit.

9. The system according to claim 7 wherein said electrical circuit comprises a Wheatstone bridge, said plurality of plates forming at least a portion of one leg of said Wheatstone bridge.

10. A method for non-destructively measuring degradation of wire insulation, said method comprising:
    placing a wire within a clamping device such that insulation associated with the wire is a portion of a dielectric between a plurality of spaced plates forming a capacitance within the clamping device, wherein the clamping device includes a first jaw and a second jaw, the plurality of plates including a first set of plates on the first jaw and a second set of plates on the second jaw, each of the first and second set of plates including an alternating arrangement of plates held at a first potential and plates held at a second potential different than the first potential;
    determining at least one of a capacitance and a dissipation factor of the plate and wire insulation combination; and
    calculating a state of degradation for the wire insulation by comparing at least one of the determined capacitance and the determined dissipation factor against a respective capacitance and dissipation factor associated with known good wire insulation.

11. The method according to claim 10 wherein placing the wire within a clamping device comprises placing the wire within a clamping device wherein the first potential is a ground electric potential and the second potential is a potential other than ground.

12. The method according to claim 11 wherein placing the wire within a clamping device comprises placing the wire within a clamping device wherein plates proximate both ends of the clamping device are held at the ground electric potential.

13. The method according to claim 10 wherein determining a capacitance of the plate and wire insulation combination comprises utilizing the capacitance formed by the plurality of plates and the wire insulation as at least a portion of one of the capacitance portion of an LCR circuit and one leg of a Wheatstone bridge.

14. The method according to claim 10 further comprising placing the plurality of plates such that the plates extend circumferentially along about 90 percent of the circumference of a channel within the clamping device into which the wire insulation to be tested is placed.

15. A device for engaging an in circuit wire for the purpose of determining a degradation of the insulation associated with the wire, said device comprising:
    a clamp for engaging the wire to be tested, said clamp comprising a first jaw and a second jaw, said first jaw and said second jaw each comprising a half-channel formed therein along a longitudinal axis of said jaws, said jaws configured for placement adjacent one another in a first position such that said half-channels in combination form a channel for placement of the wire to be tested, said jaws configured for placement apart from one another in a second position for insertion and removal of the wire to be tested; and
    a plurality of plates placed within both of said half-channels, said plurality of plates comprising a first set of plates on said first jaw and a second set of plates on said second jaw, said first and second set of plates each including an alternating arrangement of plates electrically connected at a ground electrical potential and plates electrically connected at a potential other than ground such that wire insulation placed within said half-channels provides a dielectric for a capacitor formed by said plurality of plates.

16. The device according to claim 15 further comprising a resistance and an inductance mounted within said clamp, said inductance, said plurality of plates, and said resistance configured as respective portions of an LCR circuit.

17. The device according to claim 15 further comprising a plurality of capacitors mounted within said clamp, said capacitors and said plurality of plates configured as respective portions of a Wheatstone bridge.

* * * * *